(12) United States Patent
Olsen et al.

(10) Patent No.: US 12,261,039 B2
(45) Date of Patent: *Mar. 25, 2025

(54) METHOD OF LINEARIZED FILM OXIDATION GROWTH

(71) Applicant: Applied Materials, Inc., Santa Clara, CA (US)

(72) Inventors: Christopher S. Olsen, Fremont, CA (US); Tobin Kaufman-Osborn, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/185,205

(22) Filed: Mar. 16, 2023

(65) Prior Publication Data

US 2023/0223250 A1    Jul. 13, 2023

Related U.S. Application Data

(63) Continuation of application No. 17/169,866, filed on Feb. 8, 2021, now Pat. No. 11,610,776.

(51) Int. Cl.
| | |
|---|---|
| *H01L 21/02* | (2006.01) |
| *H10B 41/50* | (2023.01) |
| *H10B 43/50* | (2023.01) |

(52) U.S. Cl.
CPC ........ *H01L 21/0228* (2013.01); *H01L 21/022* (2013.01); *H01L 21/02274* (2013.01); *H01L 21/02293* (2013.01); *H10B 41/50* (2023.02); *H10B 43/50* (2023.02)

(58) Field of Classification Search
None
See application file for complete search history.

(56) References Cited

U.S. PATENT DOCUMENTS

| | | | |
|---|---|---|---|
| 7,148,153 B2 | 12/2006 | Chen et al. | |
| 7,169,714 B2 | 1/2007 | Chaudhry et al. | |
| 11,610,776 B2* | 3/2023 | Olsen ................ | H01L 21/02326 |
| 2009/0081884 A1 | 3/2009 | Yokota et al. | |
| 2020/0194251 A1 | 6/2020 | Swenberg et al. | |
| 2020/0227256 A1 | 7/2020 | Olsen et al. | |
| 2020/0332415 A1 | 10/2020 | Bhuyan et al. | |
| 2020/0350158 A1 | 11/2020 | Yang et al. | |

OTHER PUBLICATIONS

International Search Report issued to PCT/US2022/011963 on May 4, 2022.

* cited by examiner

*Primary Examiner* — Asok K Sarkar
(74) *Attorney, Agent, or Firm* — Patterson + Sheridan, LLP

(57) ABSTRACT

Methods of forming an oxide layer over a semiconductor substrate are provided. The method includes forming a first oxide containing portion of the oxide layer over a semiconductor substrate at a first growth rate by exposing the substrate to a first gas mixture having a first oxygen percentage at a first temperature. A second oxide containing portion is formed over the substrate at a second growth rate by exposing the substrate to a second gas mixture having a second oxygen percentage at a second temperature. A third oxide containing portion is formed over the substrate at a third growth rate by exposing the substrate to a third gas mixture having a third oxygen percentage at a third temperature. The first growth rate is slower than each subsequent growth rate and each growth rate subsequent to the second growth rate is within 50% of each other.

20 Claims, 6 Drawing Sheets

METHOD OF LINEARIZED FILM OXIDATION GROWTH

CROSS REFERENCE TO RELATED APPLICATIONS

This application is a continuation of and claims priority to U.S. patent application Ser. No. 17/169,866 filed Feb. 8, 2021, which is incorporated herein by reference.

BACKGROUND

Field

Embodiments of the present disclosure generally relate to semiconductor device fabrication, and more particularly, to oxidation of a substrate, such as a semiconductor substrate.

Description of the Related Art

The integrated circuit (IC) market is continually demanding greater memory capacity, faster switch speeds, and greater feature density. In order to enable fabrication of next generation devices and structures, three dimensional (3D) stacking of semiconductor memory chips are often used to improve performance of the transistors. By arranging transistors in three dimensions instead of conventional two dimensions, multiple transistors may be placed in the integrated circuits very close to each other. Three dimensional stacking of semiconductor chips reduces wire lengths, keeps wiring delay low and increases area device density on the chip. When forming flash memory structures, a film stack is disposed on a substrate and an etch process is performed to etch a trench in the film stack. Due to the requirement of the high number of the repeatedly alternating layers in the film stack for higher device performance, the film stack with channel structures often have high aspect ratios. Moreover, manufacturers are continuously increasing the height of the stacks which increases the length of the channel. The oxide layer is formed by exposing the stack to an oxidation process. The oxidation processes are conventionally performed either thermally and/or using plasma.

These features are processed using an oxidation process to produce oxide film along channels with high aspect ratios and/or oxide film over long, narrow features. Current oxidation processes have non-conformal film growth behavior due to the reaction kinetics of the interaction between the process gases and silicon surfaces. Non-conformal oxide layers result in poor device performance or failure. Moreover, it is possible to increase oxidation time to improve conformality of the oxide film, however, increased oxidation time affects overall device throughput.

Thus, there is a need for an improved method for forming conformal oxide film layers.

SUMMARY

Embodiments of the present disclosure generally relate to a method of forming an oxide layer over a semiconductor substrate. The oxide layer contains a first oxide containing portion formed at a first growth rate by exposing the substrate to a first gas mixture having a first oxygen percentage at a first temperature. A second oxide containing portion is formed over the substrate at a second growth rate by exposing the substrate to a second gas mixture having a second oxygen percentage at a second temperature. A third oxide containing portion is formed over the substrate at a third growth rate by exposing the substrate to a third gas mixture having a third oxygen percentage at a third temperature. The first growth rate is slower than each subsequent growth rate and each growth rate subsequent to the second growth rate is within 50% of each other.

In another embodiment, a method of forming an oxide layer on a semiconductor substrate is provided. The method includes introducing a gas mixture into a volume of a process chamber and increasing a process attribute of the volume of the process chamber in two or more attribute conditions of the substrate on a substrate support in two or more attribute conditions beginning at a first condition of a plurality of conditions. Increasing the attribute includes increasing from the first attribute condition incrementally to each attribute condition and to a final attribute condition. Each transition to a subsequent attribute condition corresponds with respective ramp times. Each of the attribute conditions between each increment are maintained at respective soak times, Each of the soak times are greater than each of the ramp times. The attribute is temperature, oxygen percentage of the gas mixture, or a combination thereof.

In yet another embodiment, a method of forming an oxide layer over a substrate is provided. The method includes determining a total growth coefficient for forming portions of the oxide layer. The total growth coefficient is determined based on a predetermined total thickness of the oxide layer, a total process time to form the oxide layer, and a predetermined conformality tolerance. The predetermined conformality tolerance is determined based on deviation of oxide layer thickness at two or more locations on a surface of the substrate. A plurality of sub-operations and corresponding growth coefficients are determined. The corresponding growth coefficients together form a linear interpolation between zero and the total growth coefficient. The plurality of sub-operations includes a ramp time between sub-operations, a soak time, oxygen percentage of a gas mixture used to form each portion of the oxide layer, and temperature in each sub-operations. Each subsequent sub-operation of the plurality of sub-operations includes an increase in temperature, oxygen percentage, or combination thereof. Each ramp time is substantially equal to one another and each ramp time is less than each soak time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a method of forming an oxide layer in multiple sub-operations, each sub-operation includes attribute conditions, such as temperature and/or gas composition conditions. The conditions and time in each sub-operation is controlled to produce a substantially linear growth rate of the oxide film. A plurality of oxide containing portions of the oxide film is formed over a semiconductor substrate using a plurality of sub-operations. Each sub-operation for each oxide containing portion modifies at least one attribute, such as incrementing temperature or incrementing oxygen percentage of a gas mixture used to form portions of the oxide film. Temperature and oxygen percentage are modified simultaneously or one is varied while the other is fixed. Each sub-operation includes corresponding growth rates of the oxide film. The number of sub-operations and the sub-operation attribute conditions are determined to control the oxidation growth rate to produce a conformal oxide film over the substrate.

Figure 1:
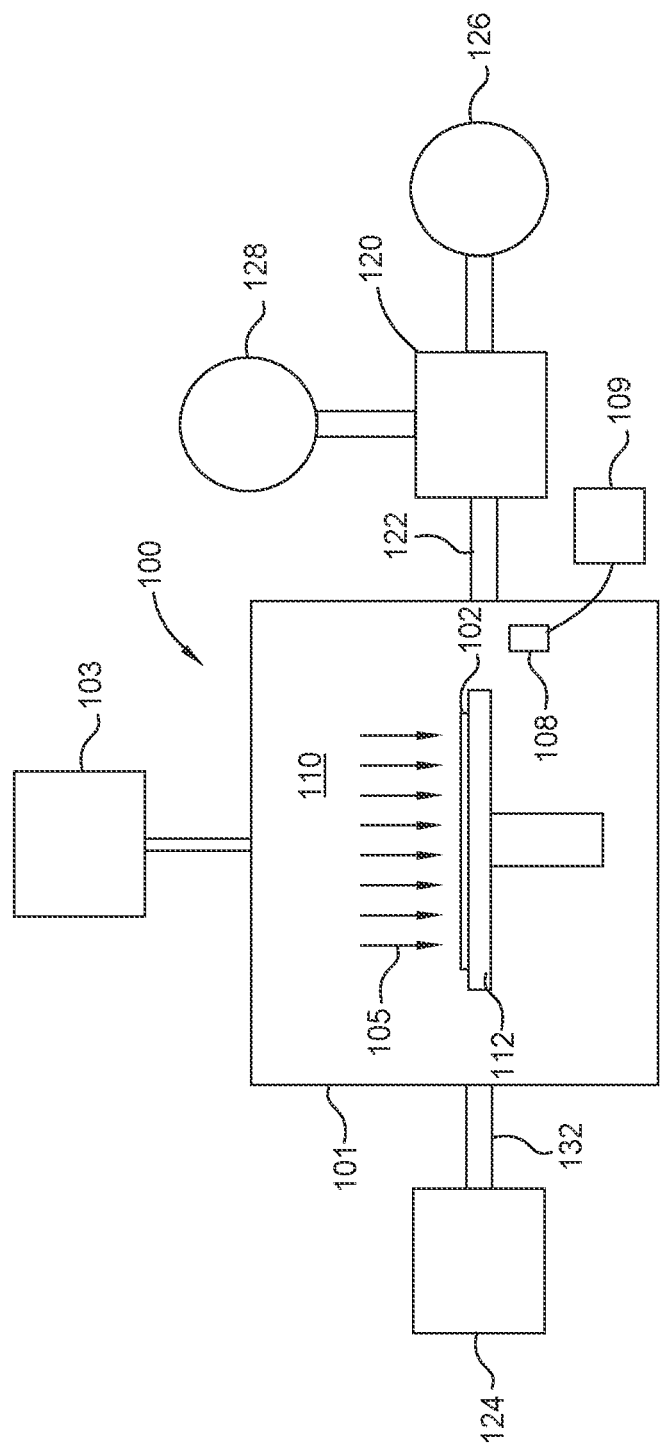
FIG. 1 depicts a schematic representation of a thermal processing chamber with a remote plasma source according to an embodiment.

Methods of the present disclosure are carried out in suitably equipped plasma reactors and/or thermal processing chamber, such as a rapid thermal processing (RTP) chamber or small batch fast ramp thermal furnace. FIG. 1 depicts a process chamber 100, such as an RTP chamber with a remote plasma source 120 according to an embodiment. The RTP chamber employs heating from radiant heat, such as from a heat incandescent lamp, or from radiant energy, such as from a laser annealing system.

The process chamber 100 includes a chamber body 101 defining a process volume 110 in which a substrate 102 may be thermally processed. The substrate 102 is positioned on a substrate support 112, such as on pins or on an edge ring of low mass for fast temperature ramping. An energy source 103 is configured to direct radiant energy 105 towards the process volume 110. A sensor 108 is disposed in position to measure an attribute of components in the interior chamber body 101. The sensor 108 is configured to measure temperature of the substrate 102 by obtaining and measuring radiant energy from the substrate 102. The sensor 108 may be connected to a system controller 109, which may be used to adjust the energy source 103 according to the measurement from the sensor 108.

Connected with the processing chamber 100 is a remote plasma source (RPS) 120. The RPS 120 employed herein are any suitable RPS capable of forming a remote plasma with at least oxygen. The RPS 120 is fluidly coupled to the processing chamber 100 through a first tubing 122. An oxygen gas source 126 is also fluidly coupled to the RPS 120, such as microwave, capacitive source, or an inductively coupled remote plasma source. Further embodiments can include an inert gas source 128 coupled with the RPS 120 so as to create an oxygen/inert gas plasma which can be delivered to the process volume 110 of the processing chamber 100.

A hydrogen gas source 124 is coupled to the processing chamber 100. The hydrogen gas source 124 delivers hydrogen gas to the process volume 110 via second tubing 132, where the hydrogen gas will be activated by the oxygen plasma delivered from the RPS 120.

Temperature control facilitates the formation of quality silicon oxide. As such, the process chamber 100 and/or components such as the substrate support 112, used in embodiments described herein are controllable to temperatures between about 500° C. to about 1100° C. with fast heating and cooling of the substrate 102 in the process chamber 100.

Figure 2A:
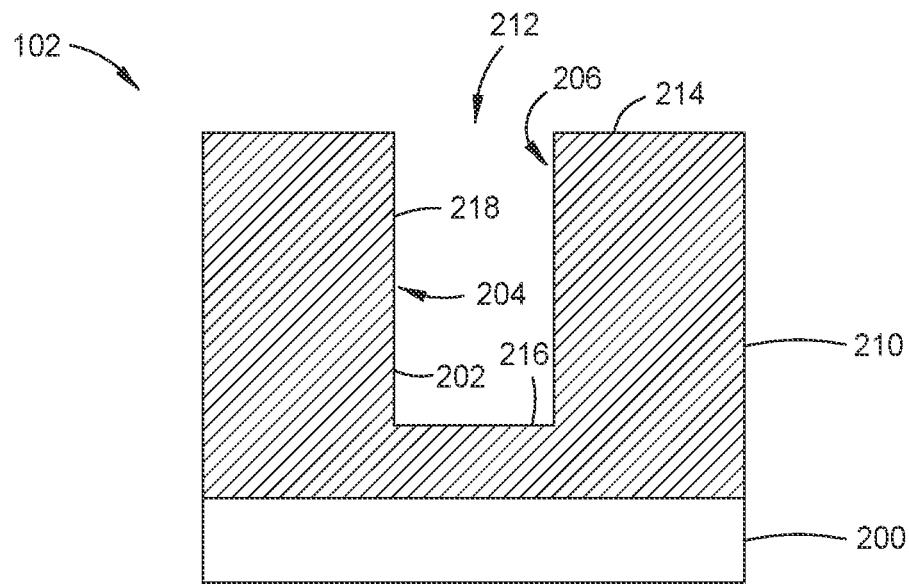
FIGS. 2A and 2B depicts a schematic cross-sectional view of a channel feature before and after an oxidation process according to an embodiment.
Figure 2B:
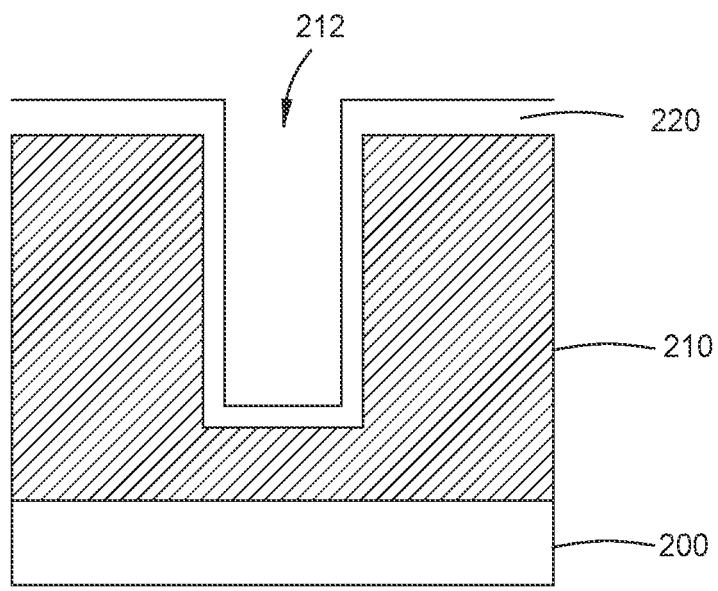

FIGS. 2A and 2B depicts a schematic cross-sectional view of a channel structure before and after an oxidation process according to an embodiment. FIG. 2A depicts a partially fabricated semiconductor structure (e.g., substrate 102). The structure includes a base substrate 200 having a first layer 210 on the surface of the substrate 200. The first layer 210 includes a channel structure 212 having a top 214, a bottom 216 and sidewalls 218. The sidewalls 218 include portions divided in thirds, including a top portion 206, a mid-portion 204, and a lower portion 202. The first layer 210 of the substrate 102 is composed of a semiconductor composition, such as silicon or silicon-containing compositions such as silicon nitride, or silicon carbide. The first layer 210 is a single layer, or it is a stack of layers. One or more of the stack of layers are deposited using atomic layer deposition (ALD) or plasma enhanced chemical vapor deposition (PECVD). The channel structure 212 includes two sidewalls 218, but it will be understood that other structures 212 could be used having one, two, three, four, or more sidewalls, or parts of sidewall. For example, vias may benefit from aspects of the disclosure. The channel structure 212 has an aspect ratio greater than about 10:1, such as about 50:1 to about 100:1.

FIG. 2B is the channel structure 212 after an oxidation process of the present disclosure. An oxide layer 220 is produced over the silicon layer 210 by oxidation of a surface of the silicon layer 210. The oxidation process includes introducing oxygen and hydrogen into the process chamber. Conventionally, hydrogen is introduced at relatively low concentrations and a high process temperature is used over a single step. The silicon surface is oxidized in oxygen, such as atomic oxygen, including a species generated by an oxygen plasma, or gaseous chemical combustion using hydrogen and oxygen gas. The use of hydrogen ($H_2$) gas and oxygen gas ($O_2$), including oxygen gas activated by a plasma enables conditions used to oxidize silicon. A single high temperature oxidation process (e.g., a conventional oxidation process) produces a film over the channel having a conformality of less than 95%. Conformality, as used herein, is defined as the ratio of oxide layer thickness between an oxide layer formed on lower portion 202 of the channel structure 212, and the top portion 206 of the channel structure 212. In contrast, a multi-temperature oxidation process described in the present disclosure provides for a conformality of 95% to 100%. Thickness measurements are made using any method known for measuring film thickness, such as by using transmission electron microscopy (TEM).

Figure 3:
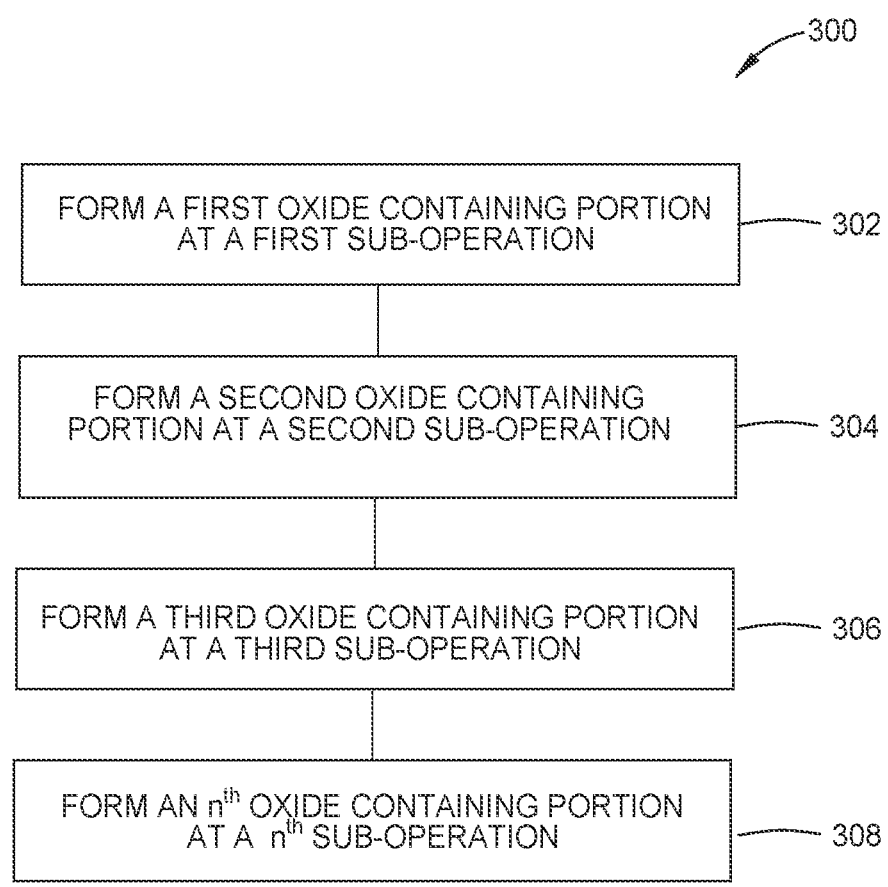
FIG. 3 depicts a flow diagram of a method for forming an oxide layer over a silicon substrate according to an embodiment.

FIG. 3 depicts methods 300 for forming an oxide layer over a silicon substrate according to an embodiment. The oxide layer is formed by exposing a silicon containing surface, such as poly-silicon or silicon nitride film, on a substrate to oxygen plasma in the presence of heat. Each of the operations are described herein with reference to the remaining figures, FIGS. 4-6. In operation 302, a first oxide containing portion is formed at a first sub-operation. A second oxide containing portion is formed at a second sub-operation in operation 304, a third oxide containing portion is formed at a third sub-operation in operation 306, and operation 308 represents a plurality of sub-operations for an nth number of sub-operations.

The first oxide containing portion of the oxide layer is formed by introducing gas mixture to the chamber at a flow rate of about 1 slm to about 15 slm, such as about 10 slm. The gas mixture is about 5% to about 90% of hydrogen gas, such as about 15% to about 50% of hydrogen gas, about 0 to about 50% of argon gas, and about 5% to about 95% oxygen gas, such as about 10% to about 50%, such as about 20% to about 30%, alternatively from about 60% to about 90%, such as about 70% to about 80%. As used herein, percentages (%) with respect to gases are on an atomic basis. The overall chamber pressure is maintained at about 0.5 Torr to about 3 Torr, such as about 1 Torr to about 2 Torr. The present disclosure provides a method for adjusting the oxygen percentage of the gas mixture incrementally using a fixed hydrogen and argon gas flow rates and adjusting the oxygen gas flow rate or adjusting one or more of hydrogen and argon flow rate while maintaining the oxygen gas flow rate. In some embodiments, a temperature of the substrate is fixed while adjusting the oxygen percentage in the gas mixture.

The first temperature of the substrate is about 550° C. to about 620° C., such as about 610° C. The multi-operation oxidation process described in the present disclosure follows an overall kinetic behavior similar to a graphical representation depicted as 404 in FIG. 4. The kinetic behavior of the reaction in operation 302 of the multi-operation oxidation process is represented in a first sub-operation 410, defined between a first time 409 and a second time 411. In contrast, conventional oxidation processes follow a kinetic behavior similar to a graphical representation depicted by 402 of FIG. 4. Although the graphical representation 402 appears to be half-parabolic shaped, the single operation kinetic behavior can have other non-linear shapes, such as those represented by logarithmic functions or exponential functions. The horizontal axis (t) is a measure of time, such as in seconds (s), and the vertical axis (Y) is a measure of thickness of the oxide layer, such as in Angstroms (Å), such that the graph 402 represents film thickness growth over time and each data point has the units Å/√sec. A general kinetic equation is governed by:

$$Y_n = \sum_{1}^{n}(A_m \times (t - h_m)^z)$$ Equation 1A

Y is the oxidation growth for n total number of operations (e.g., total cumulative growth over all operations m); t is time; A is an experimentally derived growth coefficient, such as between about 1 Å*sec$^{-1/2}$ and about 12 Å*sec$^{-1/2}$, governing each operation m; z is any number (e.g., fraction) greater 0 and less than 1, such as about ½, and h is a time shift for each elapsed operation m.

The general horizontal parabolic kinetic equation for z=½ is governed by:

$$Y_n = \sum_{1}^{n}(A_m \times (t - h_m)^{1/2})$$ Equation 1B

As used herein, a coefficient increment is a difference between each pair of sequential sub-operations. Slower growth coefficient conditions are used for thin oxide growth thicknesses (Y) and faster growth coefficient conditions are used for thick oxide growth thicknesses (Y). Without being bound by theory, it is believed that diffusion of oxidants to the growth interface, such as an interface composed of silicon has fast kinetics initially as the oxidants diffuse quickly. As the oxide film grows, the reactivity of the interfaces substantially decreases. If a relatively thin surface is to be formed, conditions for slower growth are used to provide conformal, thin film within a reasonable processing time. Slowing the growth, or slowing the reactivity of the thin film formation enables oxidants to penetrate further down features having high aspect ratios. Conventional processes typically show evidence of reactants being consumed at upper portions of channels and are greatly reduced deeper within the features.

Figure 5:
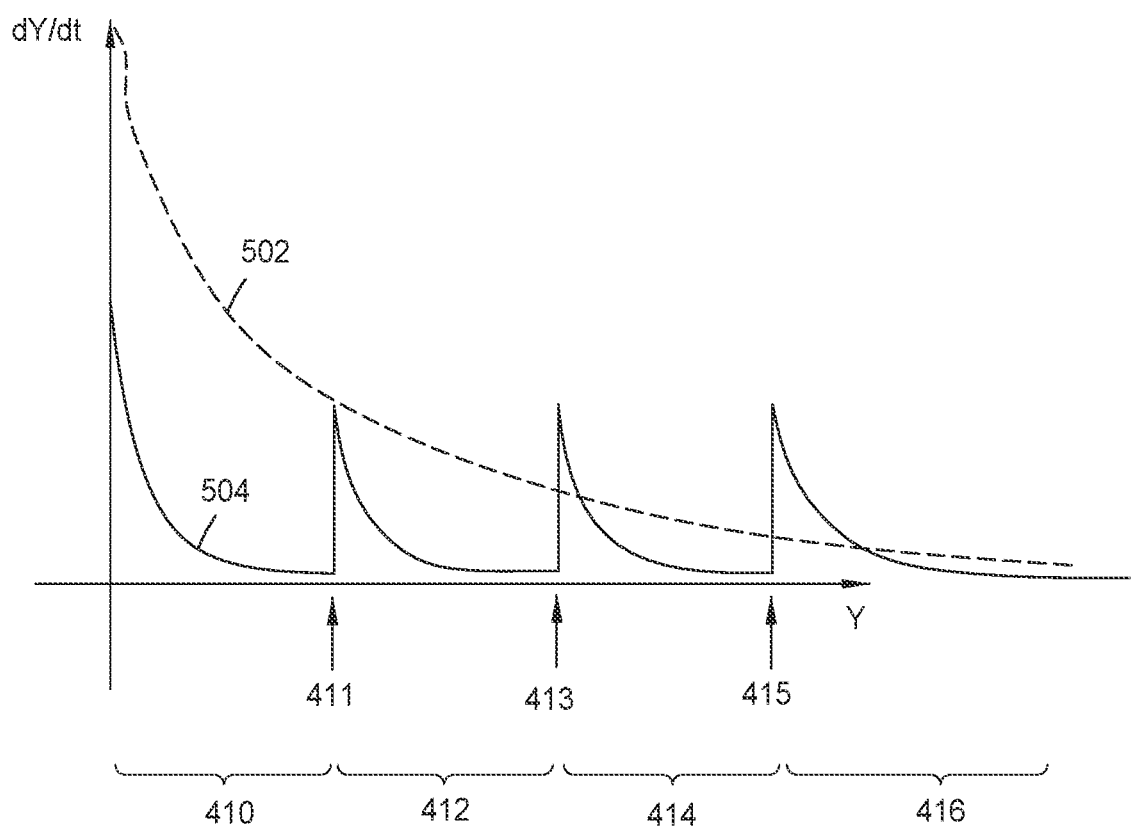
FIG. 5 depicts an illustrative graphical representation of a kinetic rates over oxidation thickness growth for a comparative oxidation process and an oxidation process according to an embodiment.

The kinetic rate d(Y)/dt is defined by the derivative of thickness growth over time is depicted by 502 (for a single operation oxidation process) and 504 (for multiple sub-operation oxidation processes) of FIG. 5. A general kinetic rate equation in terms of Y for each sub-operation is governed by:

$$\frac{dY_m}{dt} = z \times A_m \times t^{z-1}$$ Equation 2A

The general kinetic rate equation for z=½, for each sub-operation is governed by:

$$\frac{dY_m}{dt} = \frac{A_m}{2 \times t^{1/2}} = \left(B_m \times \frac{1}{Y_m}\right)$$ Equation 2B $B_m$ is a kinetic rate coefficient and is equal $A_m^2/2$. Multi-operation oxidation processes having two or more operations enables reduction of overall kinetic rate variation, resulting in an approximately linear rate as shown by line 440 in FIG. 4. This is also illustrated in FIG. 5 in which the kinetic rate functions for each sub-operation (e.g., 410, 412, 414, 416) are compared for single operation function 502 and the multi-operation function 504. As can be seen, the values of dY/dt of 502 at the beginning of the process (e.g., 410) are much larger than the values of 502 at the tail end of the process (e.g., 416). The kinetic rate at the first sub-operation is about 4 or more times the kinetic rate of the last sub-operation 416. In contrast, for the multi-sub-operation function 504, each of the sub-operations are substantially the same with a kinetic rate range of less than about 4 times relative to each other, such as about 1.2 to about 3 times, such as about 1.2 to about 2 times.

Figure 4:
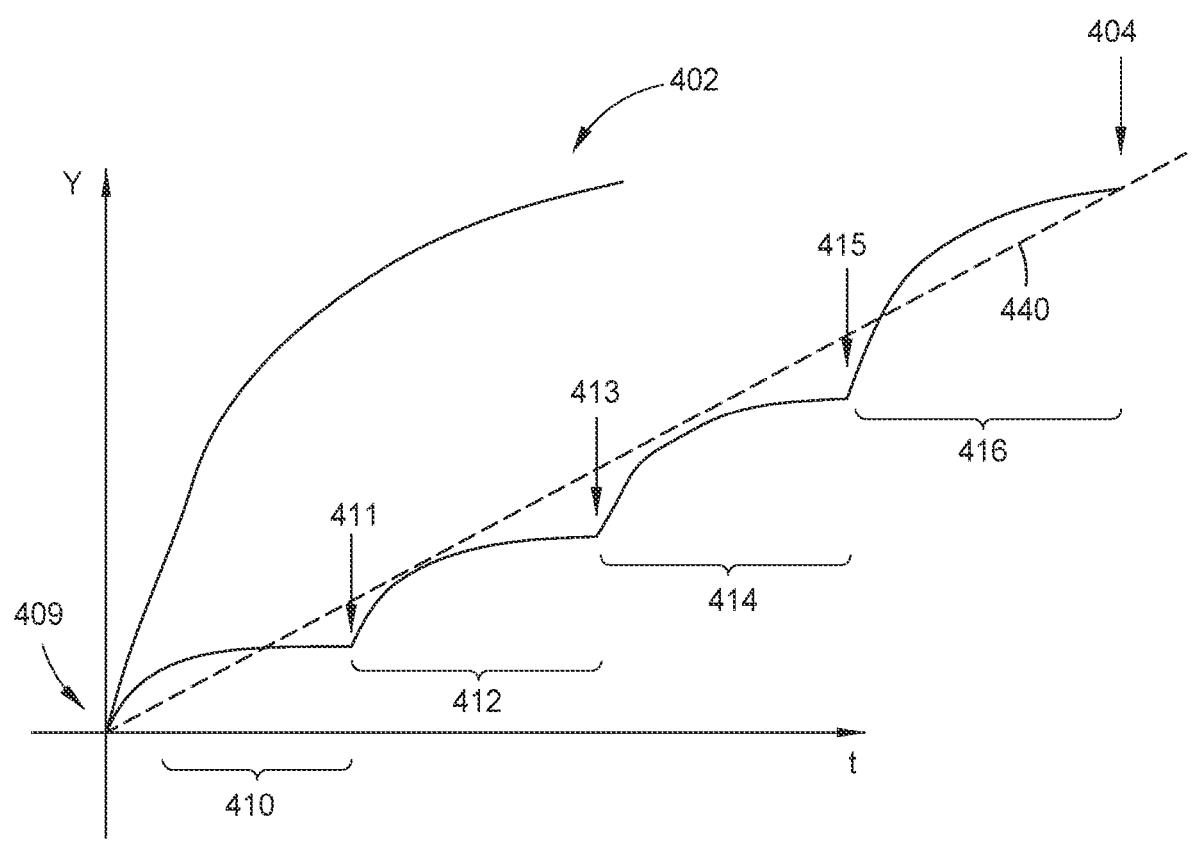
FIG. 4 depicts an illustrative graphical representation of oxidation thickness growth behaviors over time for a comparative oxidation process and an oxidation process in accordance with an embodiment.
Figure 6:
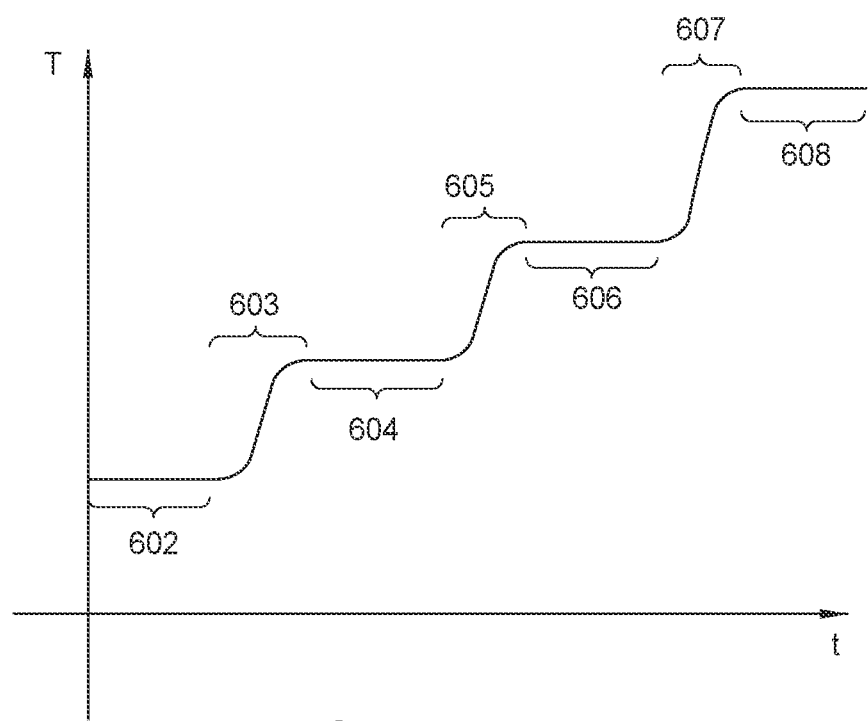
FIG. 6 depicts an illustrative graphical representation multiple temperature ramp conditions over time according to an embodiment.

As shown in FIGS. 4 and 5, the first oxide containing portion is formed in a generally slower and controlled manner at a first attribute condition, such as temperature depicted by 602 of FIG. 6 when compared to the single temperature comparative process using a single higher temperature. Although FIG. 6 depicts "T" on the vertical axis for "temperature," other attributes are also contemplated and can be controlled to provide similar behavior. In some embodiments, the attribute is a gas mixture composition, such as oxygen (atomic) percentage in the gas mixture. Operation 302 is held for a first soak period of about 10 seconds to about 30 seconds. The conditions of operation 302 are held for period that takes up about 15% to about 50% of the entire oxidation process from start to finish.

Operation 304 includes forming a second oxide containing portion of the oxide layer at a second sub-operation 412, the second sub-operation 412 includes a second attribute condition 604, such as a temperature condition. The transition from operation 302 to operation 304 is represented by first transition 411 in FIGS. 4 and 5 and first attribute ramp 603 shown in FIG. 6. Each of the attribute ramps are temperature ramps (e.g., 603, 605, 607) which increase temperatures by about 50° C. to about 90° C., such as about 60° C. to about 70° C., over a period of about 1 second to about 20 seconds, such as about 5 seconds to about 10 seconds. In some embodiments, which can be combined with other embodiments described herein, each ramp rate (e.g., heating rate) is about 50° C. to about 90° C. per second, such as about 70° C. to about 80° C. per second.

The second oxide containing portion is formed using the same gas mixture composition and gas flow rate as the first sub-operation 410 while adjusting the temperature. In addition to adjusting temperature, one or more of the gas mixture composition and the gas flow rate is adjusted to maintain a predetermined kinetic rate depicted by 504 in FIG. 5. Alternatively, the second oxide containing portion is formed using the same temperature as the first sub-operation 410 while adjusting the gas mixture, such as adjusting the oxygen percentage of the gas mixture. Adjusting the oxygen percentage of the gas mixture includes modifying the oxygen gas flow rate relative to the other gases, or modifying one or more of the other gas flow rates relative to the oxygen gas, or a combination thereof.

In some embodiments, which can be combined with other embodiments described herein, the attribute ramps (e.g., 603, 605, 607) are oxygen percentage ramps, and the vertical axis represents oxygen percentage in the gas mixture. Each oxygen percentage ramp increases oxygen percentage by about 5% to about 50%, such as about 10% to about 20%, over a period of about 1 second to about 20 seconds, such as about 5 seconds to about 10 seconds. In some embodiments, which can be combined with other embodiments described herein, each ramp rate (e.g., oxidant rate) is about 0.5% to about 10% per second, such as about 1% to about 5% per second.

Although specific ramp ranges are provided for illustrative purposes, other ramp ranges are contemplated depending on factors associated with selecting an maintaining target kinetic rates, such as desired product properties and quality, aspect ratios of channels within the process substrate, width to height ratios of elongated features to be processed, and throughput and energy considerations. The rate of the attribute ramps (e.g., 603, 605, 607) may be equal or unequal.

Each target kinetic rate for each sub-operation is also determined based on the number of sub-operations selected for the oxidation process. In particular, each target kinetic rate is obtained by adjusting operating parameters in order to maintain a substantially equal kinetic rate curve at each sub-operation. Although FIGS. 4-6 depict four sub-operation, each sub-operation having its own operating conditions, other number of sub-operations are also contemplated, such as about 2 sub-operations to about 7 sub-operations. Each sub-operation has a predetermined growth coefficient $A_m$ determined by dividing the overall growth coefficient (e.g., single operation depicted in 502) by the number of sub-operations and then incrementing each growth coefficient for each sub-operation by the coefficient increment. For illustrative purposes, for an overall growth coefficient of 12 and 4 sub-operations, the growth coefficient increment is 3 (e.g., 12 divided by 4), and each growth coefficient for each sub-operation (e.g., first, second, third, fourth) is 3, 6, 9, and 12, respectively. More generally, a growth coefficient increment can be depicted as $(A_m-A_{m-1})$ or $(A_n/n)$, wherein n is a total number of sub-operations for each sub-operation m. In the example above, $A_4$=12, n=4, and m is each sub-operation from 1 to n.

The overall growth coefficient is determined by determining an estimated growth function for an oxidation process. The estimated growth function is the kinetic behavior of oxidizing a substrate, such as a silicon substrate and determining the relationship of oxide layer growth over time under a single operation, such as a single temperature condition. In theory, a function over a long period of time and having low surface reactivity produces adequate conformality throughout the substrate surface as the oxygen penetrates into the feature and/or over the length of the surface However, long process times are not feasible in practice since longer process times reduce throughput. Moreover, a function over a short period of time and having high reactivity produces relatively high device throughput, but is limited in conformality as reactants will starve further along the feature. A single operation oxidation process uses a single high temperature and/or high oxygen gas exposure which has a high reactivity at the beginning and quickly reduces in reactivity, such as with a horizontal parabolic behavior. In contrast to conventional processes, oxidation processes performed under several different sub-operations enables slowing reactivity for the first operation at high hydrogen concentrations and a lower temperature and maintaining a generally linear behavior by ramping up the temperature and/or adjusting the reactant chemistry, such as decreasing hydrogen flow rates or increasing oxygen flow rates. The estimated growth function is a function of an estimated total growth coefficient for forming the oxide layer and a time dependent variable. A coefficient increment between sub-operations is determined by dividing the total growth coefficient by a number of sub-operations for forming the oxide layer. A first growth coefficient corresponds to forming the first oxide containing portion and is equal to the coefficient increment. Each oxide containing portion corresponds to respective growth coefficients, in which each subsequent oxide containing portion after the first oxide portion has a respective growth coefficient that is increased by the coefficient increment. The growth coefficient is a measure of oxygen reactivity with the substrate.

Other methods of determining each kinetic behavior is also contemplated, such that the multi-operation process (e.g., 404) is generally linearized compared to a comparative single-operation process (e.g., 402). The kinetic behavior is controlled by ramping the temperatures at each operation and/or adjusting the soak time for each operation. In some embodiments which can be combined with other embodiments described herein, a first soak time in the first sub-operation 410 is about 2% to about 20%, such as about 5% to about 13% less than a second soak time in the second sub-operation 412. Alternatively, the first soak time is about 2% to about 12%, such as about 5% to about 10% greater than the second soak time. In some embodiments, the second soak time is substantially equal within about 10% or about within about 5% of each respective soak time for each of the operations. Each of the soak times are determined based on a number of sub-operations (e.g., 4 sub-operations for illustrated purposes), determining a ramp time (e.g., for each of the 3 transitions between operations) between each soak time. Each ramp time is about 1 to about 10 seconds, such as about 3 seconds to about 7 seconds, such as about 5 seconds. Determining a total oxidation time such as about 40 seconds to about 120 seconds, such as about 60 seconds to about 80 seconds. The total oxidation time is dependent at least on predetermined oxide film thickness. The total oxidation time is reduced by the ramp times. Finally, each of the soak times are determined based on the estimated single operation function to produce a substantially linear kinetic reactivity curve as represented by 404 in FIG. 4. The estimated function may be refined through experimentation. The behavior of each sub-operation (see, e.g., second sub-operation 412 shown in FIG. 5), is dependent on the oxide film thickness grown from a beginning (e.g., transition 411 of FIG. 5) to an end (e.g., transition 413 of FIG. 5) of the sub-operation 412. In particular, there is an inverse relationship between the kinetic rate, $$\left(\frac{dY_m}{dt}\right),$$

and the growing oxide film thickness ($Y_m$) represented by Equation 2B $$\left(\frac{dY_m}{dt} = B_m \times \frac{1}{Y_m}\right),$$

which is dependent on the kinetic rate coefficient ($B_m = A_m^2/2$). It is believed that the kinetic rate is controlled and reduced within each sub-operation by increasing the oxide film thickness by a predetermined amount at each sub-operation. Each sub-operation includes an average kinetic rate, each average sub-operation kinetic rate is substantially equal.

Operation 306 includes forming a third oxide containing portion of the oxide layer at a third sub-operation 414. The kinetic rate, such as the average kinetic rate of the formation of the third oxide containing portion is within about 50%, such as within about 15% to 30%, or 20% to 40% of the kinetic rate of the formation of the second oxide containing portion formed in the second sub-operation. Moreover, each subsequent operation has a kinetic rate within about 50%, such as within about 15% to 30%, or 20% to 40% of the preceding sub-operation. The transition from operation 304 to operation 306 is represented by second transition 413 in FIGS. 4 and 5 and second temperature ramp 605 shown in FIG. 6. The second temperature ramp 605 includes increasing the temperature from a second temperature condition 604 to a third temperature condition 606. Operation 308 generally describes forming an $n^{th}$ oxide containing portion at a $n^{th}$ sub-operation, such as a fourth sub-operation 416 and a third transition 415 in FIG. 4. The third transition 415 includes a third attribute ramp 607 which increases the attribute condition from a third attribute condition 606 to a fourth attribute condition 608, which is further ramped sequentially in increments to the $n^{th}$ sub-operation (e.g., the last sub-operation). In some embodiments, which can be combined with other embodiments described herein, the last sub-operation includes heating the substrate to a last temperature of about 700° C. to about 1000° C., such as about 750° C. to about 850° C., such as about 800° C. The multiple sub-operation oxidation method includes ramping the temperature of the substrate from the first temperature condition (e.g., about 550° C. to about 620° C.) to the last temperature condition (e.g., about 700° C. to about 1000° C.). In some embodiments, which can be combined with other embodiments described herein, the last sub-operation includes increasing the oxygen percentage to a last oxygen percentage in the gas mixture of about 70% to about 95%. The multiple sub-operation oxidation method includes ramping the oxygen percentage of the gas mixture from the first oxygen percentage condition (e.g., about 5% to about 30%) to the last oxygen percentage condition (e.g., about 70% to about 95%). The oxygen percentage is incremented while maintaining a fixed temperature of about 700° C. to about 800° C., or the oxygen percentage is incremented while modifying the temperature at each sub-operation. The attribute increments between sub-operations are determined to produce a generally linear kinetic behavior as represented by 404 of FIG. 4. It is contemplated that any number of sub-operations, such as three or more, can be utilized. The greater the number of sub-operations which are utilized, the more linear the kinetic behavior of the oxidation.

In summation, embodiments described herein generally relate to a method of forming an oxide layer in multiple sub-operations, such as temperature and/or oxygen percentage conditions. The conditions and time in each condition is controlled to produce a substantially linear growth rate of the oxide film formed by oxidation. The method includes forming a first oxide containing portion of the oxide layer over a semiconductor substrate at a first growth rate and first attribute condition. The method further includes forming a second oxide containing portion over the substrate at a second growth rate and second attribute condition and forming a third oxide containing portion over the substrate at a third growth rate. Each of the temperatures are incrementally increased to control the oxidation growth rate to produce a conformal oxide film over the substrate.

Embodiments described herein generally relate to a method of forming a plurality of oxide containing portions of an oxide film over a semiconductor substrate using a plurality of sub-operations. Each sub-operation for each oxide containing portion modifies at least one attribute, such as incrementing temperature or incrementing oxygen percentage of a gas mixture used to form portions of the oxide film. Temperature and oxygen percentage are modified simultaneously or one is varied while the other is fixed. Each sub-operation includes corresponding growth rates of the oxide film. The number of sub-operations and the sub-operation attribute conditions are determined to control the oxidation growth rate to produce a substantially linear growth rate of the oxide film resulting in a conformal oxide film over the substrate.

While the foregoing is directed to embodiments of the present disclosure, other and further embodiments of the disclosure may be devised without departing from the basic scope thereof, and the scope thereof is determined by the claims that follow.

As used herein, the term "about" refers to a +/−10% variation from the nominal value. It is to be understood that such a variation can be included in any value provided herein.

What is claimed is:
1. A method of forming an oxide layer on a substrate comprising:
 determining a total growth coefficient for forming the oxide layer based on a predetermined total thickness of the oxide layer;

determining a number of sub-operations and corresponding growth coefficients to achieve the predetermined total thickness of the oxide layer, the corresponding growth coefficients determined by the total growth coefficient divided by the number of sub-operations; and controlling a kinetic rate related to each of the corresponding growth coefficients by at least one of controlling a ramp temperature or adjusting a soak time of the substrate exposed to an oxygen percentage of a gas mixture in each of the sub-operations.

2. The method of claim 1, further comprising increasing the oxygen percentage of each sub-operation relative to a previous sub-operation.

3. The method of claim 1, wherein the gas mixture is about 5% to about 90% of hydrogen gas, about 0% to about 50% of argon gas, and about 5% to about 95% of oxygen gas.

4. The method of claim 1, wherein the ramp temperature is increased over a period of about 1 second to about 20 seconds.

5. The method of claim 1, wherein the conditions of a first sub-operation are held for a period that takes up about 15% to about 50% of method time of all sub-operations combined.

6. The method of claim 1, wherein the temperature of a first sub-operation is about 550 degrees Celsius to about 620 degrees Celsius.

7. The method of claim 1, wherein the number of sub-operations comprises about 2 to about 7 sub-operations.

8. The method of claim 1, wherein the soak time of each sub-operation is greater than a time duration of each of the ramp temperature increase.

9. The method of claim 1, wherein the kinetic rate of each sub-operation is substantially the same.

10. The method of claim 1, wherein the soak time of the first sub-operation is about 10 seconds to about 30 seconds.

11. The method of claim 1, wherein the ramp temperature is increased by about 50 degrees Celsius to about 90 degrees Celsius for each of the number of sub-operations.

12. A method of forming an oxide layer on a substrate comprising:

determining a number of sub-operations and corresponding growth coefficients to achieve a predetermined total thickness of the oxide layer, the corresponding growth coefficients determined by a total growth coefficient divided by the number of sub-operations; and controlling a kinetic rate related to each of the corresponding growth coefficients by at least one of controlling a percentage of oxygen gas of a gas mixture or adjusting a soak time of the substrate exposed to a fixed temperature in each of the sub-operations.

13. The method of claim 12, wherein controlling the percentage of oxygen gas in the gas mixture comprises increasing an oxygen flow rate while maintaining the flow rates of remaining gases of the gas mixture.

14. The method of claim 12, wherein the gas mixture is about 5% to about 90% of hydrogen gas, about 0% to about 50% of argon gas, and about 5% to about 95% of oxygen gas.

15. The method of claim 12, wherein the fixed temperature is increased for each of the number of sub-operations to control the kinetic rate.

16. The method of claim 12, wherein the number of sub-operations comprises about 2 to about 7 sub-operations.

17. The method of claim 12, wherein the oxygen percentage of the gas mixture is increased by about 5% to about 50%, over a period of about 1 second to about 20 seconds.

18. The method of claim 12, wherein the kinetic rate is substantially the same for each sub-operation.

19. The method of claim 12, wherein the soak time of the first sub-operation is about 10 seconds to about 30 seconds.

20. A method of forming an oxide layer on a semiconductor substrate, comprising:

controlling a kinetic behavior for a number of sub-operations by controlling a kinetic rate and corresponding growth coefficients by at least one of controlling a ramp temperature or adjusting a soak time of the substrate exposed to an oxygen percentage of a gas mixture in each of the sub-operations to achieve the predetermined total thickness of the oxide layer, wherein the kinetic behavior is generally linear for the number of sub-operations performed.

* * * * *